United States Patent [19]
Wang

[11] Patent Number: 5,969,819
[45] Date of Patent: Oct. 19, 1999

[54] MEASURING SURFACE FLATNESS USING SHADOW MOIRÉ TECHNOLOGY AND PHASE-STEPPING IMAGE PROCESSING

[75] Inventor: Yinyan Wang, Atlanta, Ga.

[73] Assignee: Electronics Packaging Services Ltd. Co., Atlanta, Ga.

[21] Appl. No.: 09/090,058

[22] Filed: Jun. 3, 1998

Related U.S. Application Data

[60] Provisional application No. 60/048,690, Jun. 5, 1997.

[51] Int. Cl.$^6$ ..................................................... G01B 11/30
[52] U.S. Cl. ..................... 356/371; 356/374; 250/237 G; 382/149
[58] Field of Search ..................................... 356/374, 371, 356/376, 237.1, 394, 373; 250/237 G, 559.39, 559.46; 364/556, 570; 382/154, 145, 149, 203

[56] References Cited

U.S. PATENT DOCUMENTS

| | | |
|---|---|---|
| 4,025,195 | 5/1977 | Ebersole et al. . |
| 4,714,348 | 12/1987 | MaKosch .............................. 356/351 |

(List continued on next page.)

FOREIGN PATENT DOCUMENTS

| | | |
|---|---|---|
| 1-013406 | 1/1989 | Japan . |

OTHER PUBLICATIONS

Ming Chang et al., "High Precision Deformation Measurement by Digital Phase Shifting Holographic Interferometry," Applied Optics, vol. 24., No. 22, pp. 3780–3783, Nov. 15, 1985.

John B. Brownwell et al., "Automated Fringe Analysis for Moire Interferometry," SPIE Code, 1554, pp. 162, 1990.

Yinyan Wang et al., "Measurement Thermal Deformation of BGA Using Phase–Shifting Shadow Moiré," Society of Experimental Mechanics, Jun. 3, 1997.

John Sullivan, "Phase–Stepped Fractional Moiré," Dec., 1991, Experimental Mechanics, pp. 373–381.

(List continued on next page.)

*Primary Examiner*—Hoa Q. Pham
*Attorney, Agent, or Firm*—Jones & Askew, LLP

[57] ABSTRACT

A two-dimensional array of phase values is calculated from digitized phase-shifted shadow moiré fringe patterns that are indicative of the flatness of the surface of an object. The light intensity "$I_1$" of a pixel in a first of such shadow moiré fringe patterns is approximated by $I_0+A\cos\phi$, the light intensity "$I_2$" of the pixel in a second of such shadow moiré fringe patterns is approximated by $I_0+A\cos[\phi+(\pi/2)]$, the light intensity "$I_3$" of the pixel in a third of such shadow moiré fringe patterns is approximated by $I_0+A\cos[\phi+\pi]$, and the light intensity "$I_4$" of the pixel in a fourth of such shadow moiré fringe patterns is approximated by $A\cos[\phi+(3\pi)/2)]$. The phase values "$\phi$" are equal to $\arctan((I_2-I_4)/(I_1-I_3))$, and a first two-dimensional array of phase values are calculated. A plurality of two-dimensional arrays of image values are calculated from a first two-dimensional array of phase values, and the two-dimensional arrays of image values are filtered. A second two-dimensional array of phase values is calculated from the filtered two-dimensional arrays of image values. Discontinuities between adjacent phase values in the second two-dimensional array of phase values are identified by searching along a plurality of one-dimensional arrays of the two-dimensional array of phase values, and those discontinuities are adjusted. After the first row and, thereafter, the first column are searched, the other rows are sequentially searched, and thereafter the other columns may be sequentially searched.

18 Claims, 3 Drawing Sheets

U.S. PATENT DOCUMENTS

| | | | |
|---|---|---|---|
| 4,794,550 | 12/1988 | Greivenkamp, Jr. | 356/374 |
| 5,085,502 | 2/1992 | Womack et al. | 356/376 |
| 5,202,749 | 4/1993 | Pfister | 356/376 |
| 5,307,152 | 4/1994 | Boehnlein . | |
| 5,309,222 | 5/1994 | Kamei et al. . | |
| 5,311,286 | 5/1994 | Pike | 356/371 |
| 5,345,514 | 9/1994 | Mahdavieh et al. . | |
| 5,383,025 | 1/1995 | Forrest | 356/371 |
| 5,581,632 | 12/1996 | Koljonen et al. . | |
| 5,583,632 | 12/1996 | Haga . | |
| 5,601,364 | 2/1997 | Ume . | |
| 5,835,223 | 11/1998 | Zwemer et al. | 356/371 |

OTHER PUBLICATIONS

M. Chang et al., "Phase–Measuring Profilometry Using Sinusoidal Grating," Jun. 1993, Experimental Mechanics, pp. 117–122.

C.A. Sciammarella et al., "A Computer Based Method for Fringe Pattern Analysis," 1984.

Chiu–Ching Tsang et al., "Real Time Measurement of Printed Wiring Board Flatness in a Simulated Manufacturing Environment," Believed to be "known . . . by others" withing the meaning of 35 U.S.C. § 102 (a) before Dec. 30, 1996, Georgia Institute of Technology Publication.

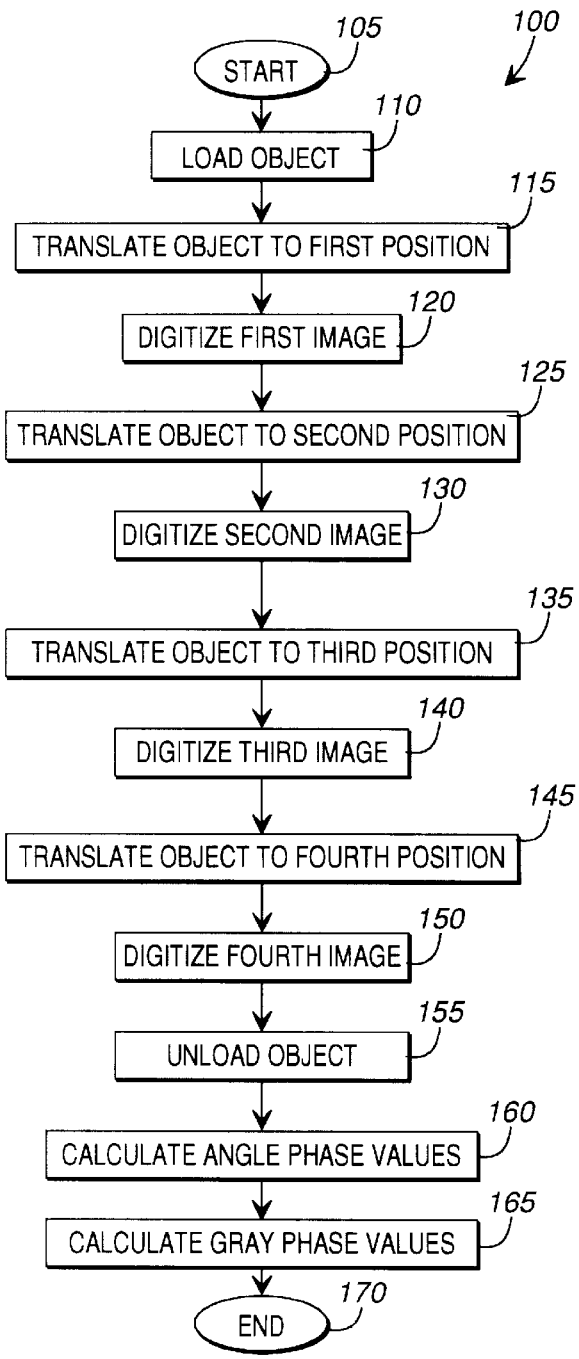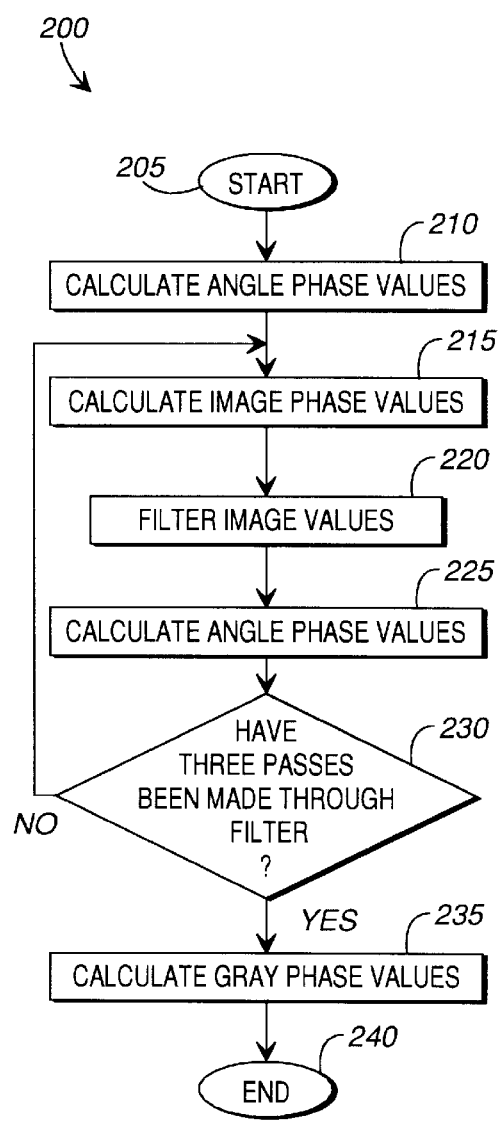
FIG. 3
FIG. 4

MEASURING SURFACE FLATNESS USING SHADOW MOIRÉ TECHNOLOGY AND PHASE-STEPPING IMAGE PROCESSING

RELATED APPLICATION

This application claims the benefit of U.S. Provisional Application Serial No. 60/048,690, which is entitled Machine for Measuring Sample Surface Flatness Using Shadow Moiré Technology and Phase-Stepping Image Processing, and was filed Jun. 5, 1997, and is incorporated herein by reference.

FIELD OF THE INVENTION

This invention relates generally to methods and systems for quantifying the surface flatness of objects, and more particularly to utilizing shadow moiré and phase-stepping image processing techniques to analyze the surface flatness of objects, such as printed circuit boards, ceramic and metal substrates, papers, plastics, woven items and the like.

BACKGROUND OF THE INVENTION

In some situations the surface flatness of objects, such as printed circuit boards, ceramic and metal substrates, papers, plastics, woven items and the like, is of special concern. For example, the manufacture of printed circuit boards and other electronic interconnection products is a multi-billion dollar global industry, and the flatness of these products is critical to their ability to undergo further manufacturing steps and to their ultimate reliability in operation as parts of computer, automobile, telecommunications, aerospace, military and other electronic systems. Non-flatness, or warpage, is a frequent problem in manufacturing due to inadequacies in design, materials, and/or processing of components, which are typically complex devices composed of several different materials. The ability to analyze surface flatness plays an important role in the designing, manufacture, processing and maintaining of objects for which surface flatness is an important characteristic.

Shadow moiré measurement techniques are known in the field of photomechanics and have been applied previously to the measurement of warpage in printed circuit boards and other electronic packaging components. Examples of systems and methods for using shadow moiré techniques for measuring the surface flatness of objects, such as printed circuit boards, are disclosed in U.S. patent application Ser. No. 08/778,214 and U.S. Pat. No. 5,601,364, both of which are incorporated herein by reference.

A shadow moiré fringe pattern is created when the surface of an object is generally parallel to a grating, and the surface is viewed through the grating. The surface is illuminated through the grating so that a shadow of the grating is cast upon the surface of the object, and the shadow and the grating interact to create a shadow moiré fringe pattern that is indicative of the warpage of the surface of the object. It is common to capture and analyze the image of the shadow moiré fringe pattern. One prior conventional technique relies on counting the number of fringes within the image to quantify the flatness of the surface of the object. For many applications, this prior technique is very satisfactory. But the resolution possible with this prior technique is comparable to the distance between the grating lines. For example, for a 100 line-per-inch horizontal grating with an angle of illumination of 45° relative to the vertical and angle of observation of 0° relative to the vertical, the resolution of the analysis is 10 mils per fringe. This resolution is too large for many required measurements where a resolution below 1 mil is necessary for quality control or performance characterization.

After the acquisition of a shadow moiré image that is indicative of the surface flatness of an object, it may be desirable to convert the image into a quantitative measurement of the out-of-plane displacement of the object at each point on the surface of the object. Using some conventional techniques of shadow moiré analysis, this conversion step is slow and difficult. A single shadow moiré image does not contain the information necessary to identify the maxima and minima in the surface contour, or the gradient of the contour at each point. Adding the required information to the analysis from other sources generally requires significant operator intervention.

It is known to use phase-shifting image processing to increase the sensitivity of shadow moiré techniques and to automatically obtain an array that identifies the displacement of relative points on the surface of the object being examined. An example of a system and method that utilize shadow moiré and phase-stepping image processing techniques to analyze the surface flatness of objects is disclosed in U.S. Pat. No. 5,307,152, which is incorporated herein by reference. Whereas the use of phase-shifting image processing with shadow moiré techniques has provided advantages, it is believed that further improvements to systems and methods for measuring surface flatness using shadow moiré technology and phase-stepping image processing would be further advantageous with respect to the design, manufacture, use and maintenance of articles of manufacture, such as printed circuit boards, ceramic and metal substrates, papers, plastics, woven items and the like.

SUMMARY OF THE INVENTION

The present invention seeks to provide improved systems and methods for measuring surface flatness using shadow moiré technology and phase-stepping image processing. In accordance with one aspect of the invention, a two-dimensional array of phase values is calculated from digitized phase-shifted shadow moiré fringe patterns that are indicative of the flatness of the surface of an object. There may be three, four or more of such phase shifted shadow moiré fringe patterns. However, in accordance with one example of the invention, the light intensity "$I_1$" of a pixel in a first of such shadow moiré fringe patterns may be approximated by $I_0+A\cos\phi$, the light intensity "$I_2$" of the pixel in a second of such shadow moiré fringe patterns may be approximated by $I_0+A\cos[\phi+(\pi/2)]$, the light intensity "$I_3$" of the pixel in a third of such shadow moiré fringe patterns may be approximated by $I_0+A\cos[\phi+\pi]$, and the light intensity "$I_4$" of the pixel in a fourth of such shadow moiré fringe patterns is approximated by $A\cos[\phi+(3\pi/2)]$. The aforementioned equations can be combined or solved, the result being that the phase values "ø" are equal to $\arctan((I_2-I_4)/(I_1-I_3))$, and a two-dimensional array of phase values can be calculated using that equation and the four digitized shadow moiré fringe patterns.

In accordance with another aspect of the present invention, at least some of the discontinuities between adjacent phase values in a two-dimensional array of phase values are identified by searching along a plurality of one-dimensional arrays of the two-dimensional array. Phase values are adjusted in response to determining that a discontinuity of a predetermined value exists between adjacent phase values. The plurality of one-dimensional arrays may comprise a row of the two-dimensional array and a column of the two-dimensional array. The row may be a first row that is at an edge of the two-dimensional array, and the column may be a first column that is at an edge of the two-dimensional array. The searching and any adjusting may be carried out for the first row and thereafter for the first column. Further, the searching carried out for the first row and the first column may originate proximate to the same corner of the two-dimensional array, and that corner may be the top, left corner of the two-dimensional array. The plurality of one-dimensional arrays may further include additional rows and columns of the two-dimensional array, and the searching carried out for each of the plurality of rows may originate proximate to the first column, whereas the searching carried out for each of the plurality of column may originate proximate to the first row. After the first row and, thereafter, the first column are searched, the other rows may be sequentially searched, and thereafter the other columns may be sequentially searched.

In accordance with another aspect of the present invention, a plurality of two-dimensional arrays of image values are calculated from a first two-dimensional array of phase values. Thereafter, a filter is applied to the plurality of two-dimensional arrays of image values. Thereafter, a second two-dimensional array of phase values is calculated from the filtered two-dimensional arrays of image values. The filtering may be a type of low-pass filter that is based upon averaging, or weighted averaging, of image values.

In accordance with another aspect of the present invention, phase shifts between shadow moiré fringe patterns indicative of the surface flatness of an object are caused by moving the object relative to an associated grating.

In accordance with another aspect of the present invention, displacement values are calculated from phase values, after discontinuities are removed from neighboring phase values. Other objects, features, and advantages of the present invention will become apparent upon review of the following description of embodiments and the appended drawings and claims.

BRIEF DESCRIPTION OF THE DRAWINGS

FIG. 3 is a flow diagram illustrating an exemplary method for acquiring shadow moiré fringe pattern images and using those images to calculate phase values.

FIG. 4 is a flow diagram illustrating an exemplary method for calculating filtered phase values.

DETAILED DESCRIPTION

Figure 1:
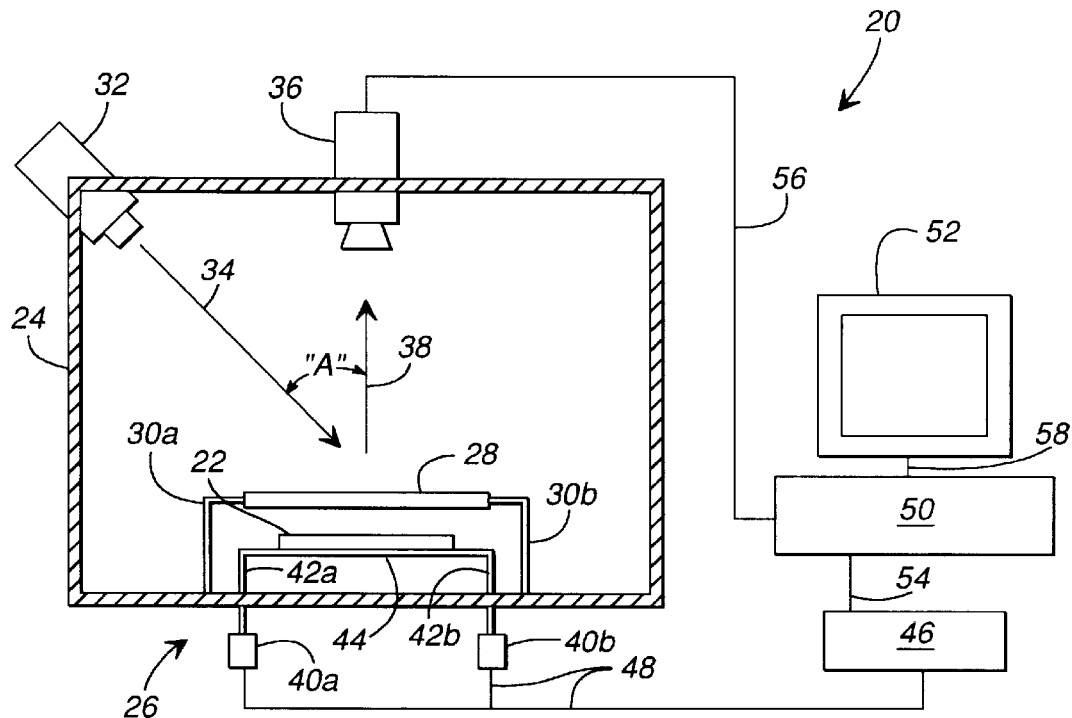
FIG. 1 is a diagrammatic side cut-away view of an exemplary system for measuring surface flatness using shadow moiré technology and phase-stepping image processing.

Turning now to the drawings in which like numbers reference like parts in the several figures, FIG. 1 is a diagrammatic side cut-away view of a system 20 for measuring surface flatness using shadow moiré technology and phase-stepping image processing. The system 20 quantifies the surface flatness of an object 22, which may be a printed circuit board, ceramic or metal substrate, paper, plastic, woven item, or the like, using shadow moiré and phase-stepping image processing techniques. The system 20 includes an enclosure 24, which may be in the form of a hood or the like, that at least partially encloses the object 22 in a manner that isolates the object from ambient light. The enclosure 24 may be equipped with a door or opening through which an object 22 can be passed into or out of the enclosure.

An object 22 being examined by the system 20 is supported by an electromechanical assembly 26, which is discussed in greater detail below. A grating 28 is suspended above the object 22. The grating is a generally planar plate of transparent material that includes multiple parallel and evenly spaced opaque lines extending across a surface of the plate. The grating 28 and the object 22 are generally parallel to one another when the object is properly placed upon the electromechanical assembly. A light source 32 illuminates the grating 28 and the object 22 at an oblique angle of incidence "A", as represented by arrow 34. The light source projects a shadow of the opaque lines of the grating 28 upon the object 22. A detector 36, such as a charged couple device camera, views the grating 28, the object 22 and the shadow cast upon the object, as indicated by arrow 38. The detector 36 views the object 22, and the shadows thereon, through the grating 28. If the upper surface of the object 22 is not flat, the interaction between the shadow cast on the object and the grating 28 causes the image received by the detector 36 to include a shadow moiré fringe pattern that is indicative of the surface flatness of the upper surface of the object. A shadow moiré fringe pattern includes alternating light and dark regions, which are called moiré fringes. The fringes correspond to contour lines of the topography of the upper surface of the object 22.

The electromechanical assembly 26 that supports the object 22 being examined maintains the upper surface of the object generally parallel to the grating 28. The electromechanical assembly 26 includes linear actuators 40a and 40b that move support arms 42a and 42b, respectively, that extend between the actuators and a platform 44 that supports the object 22. The support arms 42a and 42b may extend through openings in the enclosure 24, or the actuators 40a and 40b may be within the enclosure. The electromechanical assembly 26 further includes an actuator controller 46 that is connected to the actuators 40a and 40b by cabling 48.

A computer 50 communicates with the electromechanical assembly 26, the detector 36, and a monitor 52 by way of cables 54, 56 and 58, respectively. The computer 50 controls operation of the electromechanical assembly 26 so that the object 22 is sequentially oriented at four different elevations with respect to the grating 28, which results in the creation of four phase-shifted shadow moiré fringe patterns. Alternatively, the electromechanical assembly 26 could be reconfigured so that the grating 28 may be moved with respect to the object 22 to create the four phase-shifted shadow moiré fringe patterns. The computer 50 also controls operation of the detector 36 so that images of the four phase-shifted shadow moiré fringe patterns are captured.

More specifically, the object 22 is translated one-quarter of a period, and in the same direction between the first, second, third and fourth elevations. The value of the period is the translation required to shift the fringe pattern by one full fringe. In accordance with the exemplary embodiment of the present invention, the period is 10 mils; therefore, the object 22 is moved 2.5 mils between each of the elevations. This period is the result of the grating 28 being a Ronchi-type grating with a chromium oxide pattern of 100 lines per inch, the angle "A" of incidence of the light emitted from the light source 32 upon the grating 28 and the object 22 being approximately 45°, and the angle of incidence from which the detector 36 views the grating 28 and the object being approximately 0°.

Light Intensity Equations

Light intensity of the above-mentioned four phase-shifted shadow moiré fringe patterns can be approximated from following "Light Intensity Equations":

$$I_1 = I_0 + A\cos\phi$$

$$I_2 = I_0 + A\cos[\phi+(\pi/2)]$$

$$I_3 = I_0 + A\cos[\phi+\pi]$$

$$I_4 = I_0 + A\cos[\phi+(3\pi/2)]$$

The aforementioned Light Intensity Equations apply to each pixel position independently, within the set four phase-shifted shadow moiré fringe patterns. "$I_1$" is the light intensity at a pixel in the first shadow moiré fringe pattern, "$I_2$" is the light intensity at the same pixel position in the second shadow moiré fringe pattern, "$I_3$" is the light intensity at the same pixel position in the third shadow moiré fringe pattern, and "$I_4$" is the light intensity at the same pixel position in the fourth shadow moiré fringe pattern. "$I_0$" and "A" are constants that are different for each pixel position. "$I_0$" and "A" depend on the intensity of illumination, diffuse reflectivity and fringe contrast, among other factors. The phase term "$\phi$" is a function only of the distance from the surface of the object 22 to the grating 28 at the aforementioned pixel position.

Phase Value Equation

The aforementioned Light Intensity Equations can be combined or solved to create an equation that solves the phase term "$\phi$", and that equation is the "Phase Value Equation" presented below:

$$\phi = \arctan((I_2 - I_4)/(I_1 - I_3))$$

As seen from the aforementioned Phase Value Equation, the constants "$I_0$" and "A" are eliminated when the Light Intensity Equations are simultaneously solved for the phase term "$\phi$".

Two-Dimensional Array Convention

In accordance with the exemplary embodiment of the present invention, numerous equations and sets of data are utilized in association with the aforementioned Phase Value Equation to determine displacement values and other quantifying information for the upper surface of the object 22. Some of those sets of data can be characterized as two-dimensional arrays of values. More specifically, and for example, the images of the four phase-shifted shadow moiré fringe patterns captured by the detector 36 are digitized, and each of those digitized images can be referred to as a two-dimensional array of image values. Additionally, there are numerous versions of those two-dimensional arrays of image values. Further, what can be characterized as a two-dimensional array of phase values is calculated using two-dimensional arrays of image values and the aforementioned Phase Value Equation. Additionally, there are several versions of the two-dimensional array of phase values.

Figure 2:
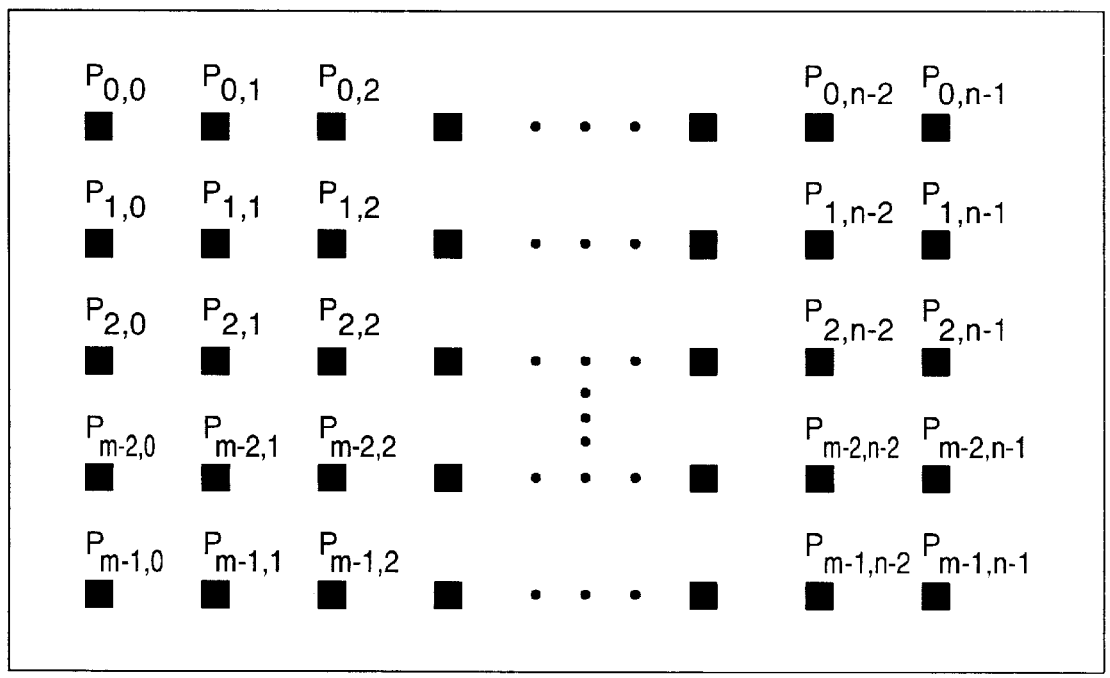
FIG. 2 illustrates a convention for defining pixel positions within a two-dimensional array.

Each of the aforementioned two-dimensional arrays of values can be characterized as a two-dimensional array of pixels or pixel data, and FIG. 2 illustrates a convention for defining pixel positions within such a two-dimensional array. Each pixel is denominated as $P_{i,j}$, where "i" is a row number and "j" is a column number. Each two-dimensional array includes "m" rows and "n" columns of pixels. The rows are numbered consecutively from top-to-bottom, starting with row zero. The columns are numbered consecutively from left-to-right, starting with column zero.

As a convention, two-dimensional arrays of pixels or pixel data corresponding to two-dimensional arrays of image values are denominated "{}Image{}", where the bracket (i.e., "{}") prior to "Image" is filled with "1", "2", "3" and "4" to respectively denominate a first two-dimensional array of image values, a second two-dimensional array of image values, a third two-dimensional array of image values and a forth two-dimensional array of image values, and the bracket (i.e., "{}") subsequent to "Image" is filled with "1", "2", "3", "4", "5", "6", and "7" to respectively denominate different versions of arrays of image values. Individual pixels within a two-dimensional array of image values are denominated as "{}Image{}$_{i,j}$", where "i" is a row number and "j" is a column number, as should be understood with reference to FIG. 2.

As a convention, two-dimensional array of pixels or pixel data corresponding to arrays of phase values are denominated "Phase{}", where the bracket (i.e., "{}") subsequent to "Phase" is filled with "1", "2", "3", "4", "5", "6" and "7" to respectively denominate different versions of arrays of phase values. Individual pixels within an array of phase values are denominated as "Phase{}$_{i,j}$", where "i" is a row number and "j" is a column number, as should be understood with reference to FIG. 2.

Re-Presented Phase Value Equation

In view of the aforementioned array conventions, the aforementioned Phase Value Equation can be re-presented as follows:

$$\text{Phase}\{\}_{i,j} = \arctan((\{2\}\text{Image}\{\}_{i,j} - \{4\}\text{Image}\{\}_{i,j})/(\{1\}\text{Image}\{\}_{i,j} - \{3\}\text{Image}\{\}_{i,j}))$$

The Re-Presented Phase Value Equation provides phase values calculated as angles between zero and $2\pi$, and each of those angular phase values can be converted to integer or "gray-scale" phase values by multiplying each of the angular phase values by "$127.5/\pi$", so that the gray-scale phase values range between zero and 255. Conversely, each of the gray-scale phase values can be converted to angular phase values by multiplying each of the gray-scale phase values by "$\pi/127.5$".

Image Value Equations

Sets of two-dimensional arrays of image data, designated as {1}Image{}, {2}Image{}, {3}Image{} and {4}Image{}, can be calculated from a two-dimensional array of angular phase values, designated as Phase{}, using the following equations, which are referred to as "Image Value Equations":

$$\{1\}\text{Image}\{\}_{i,j} = 127.5(1+\cos(\text{Phase}\{\}_{i,j}))$$

$$\{2\}\text{Image}\{\}_{i,j} = 127.5(1+\cos(\text{Phase}\{\}_{i,j}+(\pi/2)))$$

$$\{3\}\text{Image}\{\}_{i,j} = 127.5(1+\cos(\text{Phase}\{\}_{i,j}+\pi))$$

$$\{4\}\text{Image}\{\}_{i,j} = 127.5(1+\cos(\text{Phase}\{\}_{i,j}+((3\pi)/2)))$$

Filtering Equation

In accordance with the exemplary embodiment of the present invention, image values are filtered, or smoothed, by using the following equation, which is referred to as a "Filtering Equation":

$$\{\}\text{Image}\{x\}_{i,j} = (1/34)(2\{\}\text{Image}\{x-1\}_{i-1,j} + 2\{\}\text{Image}\{x-1\}_{i,j} +$$
$$2\{\}\text{Image}\{x-1\}_{i+1,j} + 2\{\}\text{Image}\{x-1\}_{i-1,j-1} +$$
$$2\{\}\text{Image}\{x-1\}_{i,j-1} + 2\{\}\text{Image}\{x-1\}_{i+1,j-1} +$$
$$2\{\}\text{Image}\{x-1\}_{i-1,j+1} + 2\{\}\text{Image}\{x-1\}_{i,j+1} +$$
$$2\{\}\text{Image}\{x-1\}_{i+1,j+1} + \{\}\text{Image}\{x-1\}_{i-2,j-2} +$$
$$\{\}\text{Image}\{x-1\}_{i-1,j-2} + \{\}\text{Image}\{x-1\}_{i,j-2} +$$
$$\{\}\text{Image}\{x-1\}_{i+1,j-2} + \{\}\text{Image}\{x-1\}_{i+2,j-2} +$$
$$\{\}\text{Image}\{x-1\}_{i-2,j+2} + \{\}\text{Image}\{x-1\}_{i-1,j+2} +$$
$$\{\}\text{Image}\{x-1\}_{i,1+2} + \{\}\text{Image}\{x-1\}_{i+2,j+2} +$$
$$\{\}\text{Image}\{x-1\}_{i-2,j+1} + \{\}\text{Image}\{x-1\}_{i-2,j} +$$
$$\{\}\text{Image}\{x-1\}_{i-2,j-1} + \{\}\text{Image}\{x-1\}_{i+2,j+1} +$$
$$\{\}\text{Image}\{x-1\}_{i+2,j} + \{\}\text{Image}\{x-1\}_{i+2,j-1})$$

In the aforementioned Filtering Equation, "$\{\}\text{Image}\{x\}$" denotes a filtered two-dimensional array of image data that is being created, where "$\{\}\text{Image}\{x\}i$," denotes specific pixels within the filtered two-dimensional array of fringe data that is being created. In contrast, "$\{\}\text{Image}\{x-1\}$" denotes the two-dimensional array of image data from which the filtered array of image data is being created, and each of the "$\{\}\text{Image}\{x-1\}_{i-1,j}$", "$\{\}\text{Image}\{x-1\}_{i,j}$", "$\{\}\text{Image}\{x-1\}_{i+1,j}$", and so on, denote specific pixels within the two-dimensional array of image data from which the filtered array of image data is being created. The Filtering Equation provides a weighted average of image data from the two-dimensional array of image data from which the filtered two-dimensional array of image data is created. More specifically, a weighted average is being calculated because the Filtering Equation includes a multiplier with each reference to a pixel of the array of image data from which the filtered array of image data is being created. The multiplier is either the number "2" or the number "1". Further, the Filtering Equation includes a denominator (for weighted averaging purposes), which is the number "34".

Referring to FIG. 2, the Filtering Equation is applied "as is" to create pixel values of the filtered array of image data, except for the pixel values of the filtered array of image data that are in the four outer rows (i.e., rows 0, 1, m-2 and m-1) or the four outer columns (i.e., columns 0, 1, n-2 and n-1) of the filtered array of image data. For each of the pixel values of the filtered array of image data that are in the four outer rows or the four outer columns of the filtered array of image data, the Filtering Equation is modified. That is, when the Filtering Equation is used and referenced pixels of the array of image data from which the filtered array of image data is being created are nonexistent, a value of zero is used for those nonexistent pixels in the Filtering Equation. Further, the denominator of the filtering equation is decreased by the sum of the multipliers of the Filtering Equation that are associated with those nonexistent pixels.

In summary, the Filtering Equation may be characterized as functioning as a low-pass filter.

Exemplary Methods of the Exemplary Embodiment

An exemplary method of using shadow moiré technology and phase-stepping image processing to quantify the surface flatness of an object 22, which may be a printed circuit board, ceramic or metal substrate, paper, plastic, woven item, or the like, is presented in conjunction with the above-discussed FIGS. 1–2 and the flow diagrams of FIGS. 3–6.

Exemplary Method for Acquiring Image Data and Calculating Phase Values

Turning now to FIG. 3, and with occasional reference to FIG. 1, an exemplary method 100 for acquiring shadow moiré fringe pattern images, and using those images to calculate phase values, will be described. The method 100 begins at the step 105 and proceeds to the step 110, where an object 22 is placed upon the platform 44 so that the object is situated as illustrated in FIG. 2. The object 22 may be manually placed upon the platform 44, or an automated system may be provided for placing the object upon the platform. For example, a conveyorized system may be provided that sequentially places objects 22 upon the platform 44. Control is transferred from the step 110 to the step 115.

At the step 115, the electromechanical assembly 26 translates the object 22 to the first elevation in the manner discussed above. Thereafter, control is transferred from the step 115 to the step 120. The light source 32 emits light the entire time that the object 22 is within the enclosure 24; therefore, a first shadow moiré fringe pattern that is indicative of the flatness of the upper surface of the object exists during the step 120. Further, at the step 120, an image of the first shadow moiré fringe pattern is captured by the detector 36, and the computer 50 digitizes the image captured by the detector. That digitized image may be characterized as a first two-dimensional array of image values, and, as a convention, that array is denominated as $\{1\}\text{Image}\{1\}$. Control is transferred from the step 120 to the step 125.

At the step 125, the electromechanical assembly 26 translates the object 22 from the first elevation to the second elevation, so that a phase shift is introduced to the first shadow moiré fringe pattern of the step 120 to create a second shadow moiré fringe pattern, as discussed above. Thereafter, control is transferred from the step 125 to the step 130.

The second shadow moiré fringe pattern, which is indicative of the flatness of the upper surface of the object, exists during the step 130. Further, at the step 130, an image of the second shadow moiré fringe pattern is captured by the detector 36, and the computer 50 digitizes the image captured by the detector. That digitized image may be characterized as a second two-dimensional array of image values, and, as a convention, that array is denominated as $\{2\}\text{Image}\{1\}$. Control is transferred from the step 130 to the step 135.

At the step 135, the electromechanical assembly 26 translates the object 22 from the second elevation to the third elevation, so that a phase shift is introduced to the second shadow moiré fringe pattern of the step 130 to create a third shadow moiré fringe pattern, as discussed above. Thereafter, control is transferred from the step 135 to the step 140. The third shadow moiré fringe pattern, which is indicative of the flatness of the upper surface of the object, exists during the step 140. Further, at the step 140, an image of the third shadow moiré fringe pattern is captured by the detector 36, and the computer 50 digitizes the image captured by the detector. That digitized image may be characterized as a third two-dimensional array of image values, and , as a convention, that array is denominated as $\{3\}\text{Image}\{1\}$. Control is transferred from the step 140 to the step 145.

At the step 145, the electromechanical assembly 26 translates the object 22 from the third elevation to the fourth elevation, so that a phase shift is introduced to the third shadow moiré fringe pattern of the step 140 to create a fourth shadow moiré fringe pattern, as discussed above. Thereafter, control is transferred from the step 145 to the step 150. The fourth shadow moiré fringe pattern, which is indicative of the flatness of the upper surface of the object, exists during the step 150. Further, at the step 150, an image of the fourth shadow moiré fringe pattern is captured by the detector 36, and the computer 50 digitizes the image captured by the detector. That digitized image may be characterized as a fourth two-dimensional array of image values, and, as a convention, that array is denominated as {4}Image{1}. Control is transferred from the step 150 to the step 155.

At the step 155, the object 22 is unloaded from platform 44. The object 22 may be manually removed from the platform 44, or an automated system may be provided for removing the object upon the platform. For example, a conveyorized system may be provided that sequentially removes objects 22 from the platform 44. Control is transferred from the step 155 to the step 160.

At the step 160, a two-dimensional array of angular phase values, which is denominated as Phase{1}, is calculated from the two-dimensional arrays of image values that were created at the steps 120, 130, 140, and 150 (which are denominated as {1}Image{1}, {2}Image{1}, {3}Image{1} and {4}Image{1}) using the above-mentioned Re-Presented Phase Value Equation. Thereafter, control is transferred from the step 160 to the step 165. At the step 165, each of the angular phase values of the array created at the step 160 (which is denominated as Phase{1}) are converted to gray-scale phase values (by multiplying each of the angular phase values by "$127.5/\pi$") to create a two-dimensional array of gray-scale phase values, which is denominated as Phase{2}. Thereafter, control is transferred from the step 165 to the step 170, where the method 100 ends.

Exemplary Method for Calculating Filtered Phase Values

Turning now to FIG. 4, and with occasional reference to FIG. 1, an exemplary method 200 for calculating filtered phase values will be described. The method 200 may follow immediately after the method 100.

The method 200 begins at the step 205 and proceeds to the step 210, where each of the gray-scale phase values of the array created at the step 165 (which is denominated as Phase{2}) is converted to an angular phase value (by multiplying each of the gray-scale phase values by "$\pi/127.5$") to create a two-dimensional array of angular phase values, which is denominated as Phase{3}. Thereafter, control is transferred to the step 215. At the step 215, four two-dimensional arrays of image values, which are denominated {1}Image{2}, {2}Image{2}, {3}Image{2} and {4}Image{2}, are calculated from the most recently created two-dimensional array of angular phase values (which was created at the step 210 and is denominated Phase{3}) using the above-mentioned Image Value Equations. Thereafter, control is transferred from the step 215 to the step 220.

At the step 220, four two-dimensional arrays of image values, which are denominated {1}Image{3}, {2}Image{3}, {3}Image{3} and {4}Image{3}, are respectively calculated from the most recently created two-dimensional arrays of image values (which were created at the step 215 and are denominated {1}Image{2}, {2}Image{2}, {3}Image{2} and {4}Image{2}) using the above-mentioned Filtering Equation. That is, using the Filtering Equation, the array denominated as {1}Image{3} is calculated from the array denominated as {1}Image{2}, the array denominated as {2}Image{3} is calculated from the array denominated as {2}Image{2}, the array denominated as {3}Image{3} is calculated from the array denominated as {3}Image{2}, and the array denominated as {4}Image{3} is calculated from the array denominated as {4}Image{2}. Thereafter, control is transferred from the step 220 to the step 225.

At the step 225, a two-dimensional array of angular phase values, which is denominated as Phase{4}, is calculated from the most recently created two-dimensional arrays of image values (which were created at the step 220 and are denominated as {1}Image{3}, {2}Image{3}, {3}Image{3} and {4}Image{3}) using the above-mentioned Re-Presented Phase Value Equation. Thereafter, control is transferred from the step 225 to the step 230, where a determination is made as to whether three passes have been made through the steps 215–225 in a single pass through the method 200. Because three passes have not been made through the steps 215–225 in a single pass through the method 200, control is transferred back to the step 215.

At the second occurrence of the step 215 in a single pass through the method 200, four two-dimensional arrays of image values, which are denominated {1}Image{4}, {2}Image{4}, {3}Image{4} and {4}Image{4}, are calculated from the most recently created two-dimensional array of angular phase values (which was created at the step 225 and is denominated Phase{4}) using the above-mentioned Image Value Equations. Thereafter, control is transferred from the step 215 to the step 220. At the step 220, four two-dimensional arrays of image values, which are denominated {1}Image{5}, {2}Image{5}, {3}Image{5} and {4}Image{5}, are respectively calculated from the most recently created two-dimensional arrays of image values (which were created at the step 215 and are denominated {1}Image{4}, {2}Image{4}, {3}Image{4} and {4}Image{4}) using the above-mentioned Filtering Equation. That is, using the Filtering Equation, the array denominated as {1}Image{5} is calculated from the array denominated as {1}Image{4}, the array denominated as {2}Image{5} is calculated from the array denominated as {2}Image{4}, the array denominated as {3}Image{5} is calculated from the array denominated as {3}Image{4}, and the array denominated as {4}Image{5} is calculated from the array denominated as {4}Image{4}. Thereafter, control is transferred from the step 220 to the step 225.

At the step 225, a two-dimensional array of angular phase values, which is denominated as Phase{5}, is calculated from the most recently created two-dimensional arrays of image values (which were created at the step 220 and are denominated as {1}Image{5}, {2}Image{5}, {3}Image{5} and {4}Image{5}) using the above-mentioned Re-Presented Phase Value Equation. Thereafter, control is transferred from the step 225 to the step 230, where a determination is made as to whether three passes have been made through the steps 215–225 in a single pass through the method 200. Because three passes have not been made through the steps 215–225 in a single pass through the method 200, control is transferred back to the step 215.

At the third occurrence of the step 215 in a single pass through the method 200, four two-dimensional arrays of image values, which are denominated {1}Image{6}, {2}Image{6}, {3}Image{6} and {4}Image{6}, are calculated from the most recently created two-dimensional array of angular phase values (which was created at the step 225 and is denominated Phase{5}) using the above-mentioned Image Value Equations. Thereafter, control is transferred from the step 215 to the step 220. At the step 220, four two-dimensional arrays of image values, which are denominated {1}Image{7}, {2}Image{7}, {3}Image{7} and {4}Image{7}, are respectively calculated from the most recently created two-dimensional arrays of image values (which were created at the step 215 and are denominated {1}Image{6}, {2}Image{6}, {3}Image{6} and {4}Image{6}) using the above-mentioned Filtering Equation. That is, using the Filtering Equation, the array denominated as {1}Image{7} is calculated from the array denominated as {1}Image{6}, the array denominated as {2}Image{7} is calculated from the array denominated as {2}Image{6}, the array denominated as {3}Image{7} is calculated from the array denominated as {3}Image{6}, and the array denominated as {4}Image{7} is calculated from the array denominated as {4}Image{6}. Thereafter, control is transferred from the step 220 to the step 225.

At the step 225, a two-dimensional array of angular phase values, which is denominated as Phase{6}, is calculated from the most recently created two-dimensional arrays of image values (which were created at the step 220 and are denominated as {1}Image{7}, {2}Image{7}, {3}Image{7} and {4}Image{7}) using the above-mentioned Re-Presented Phase Value Equation. Thereafter, control is transferred from the step 225 to the step 230, where a determination is made as to whether three passes have been made through the steps 215–225 in a single pass through the method 200. Because three passes have been made through the steps 215–225 in a single pass through the method 200, control is transferred to the step 235.

At the step 235, each of the angular phase values of the most recently created two-dimensional array of angular phase values (which was created at the step 225 and is denominated as Phase{6}) is converted to a gray-scale phase value (by multiplying each of the angular phase values by "127.5/π") to create a two-dimensional array of gray-scale phase values, which is denominated as Phase{7}. Thereafter, control is transferred from the step 235 to the step 240, where the method 200 ends.

Exemplary Method for Unwrapping Phase Values

Figure 5:
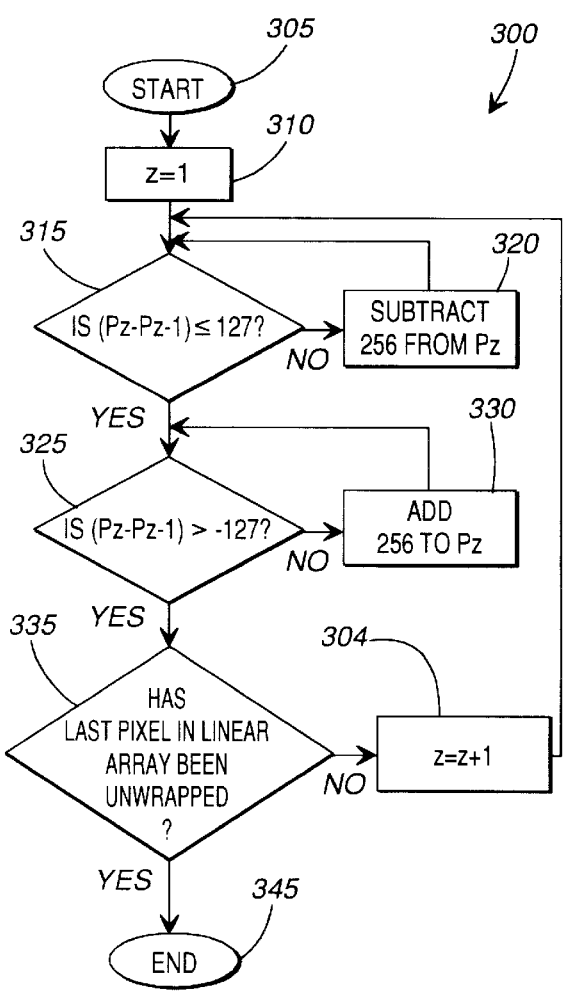
FIG. 5 is a flow diagram illustrating an exemplary method for resolving discontinuities between neighboring values in a one-dimensional array of phase values.
Figure 6:
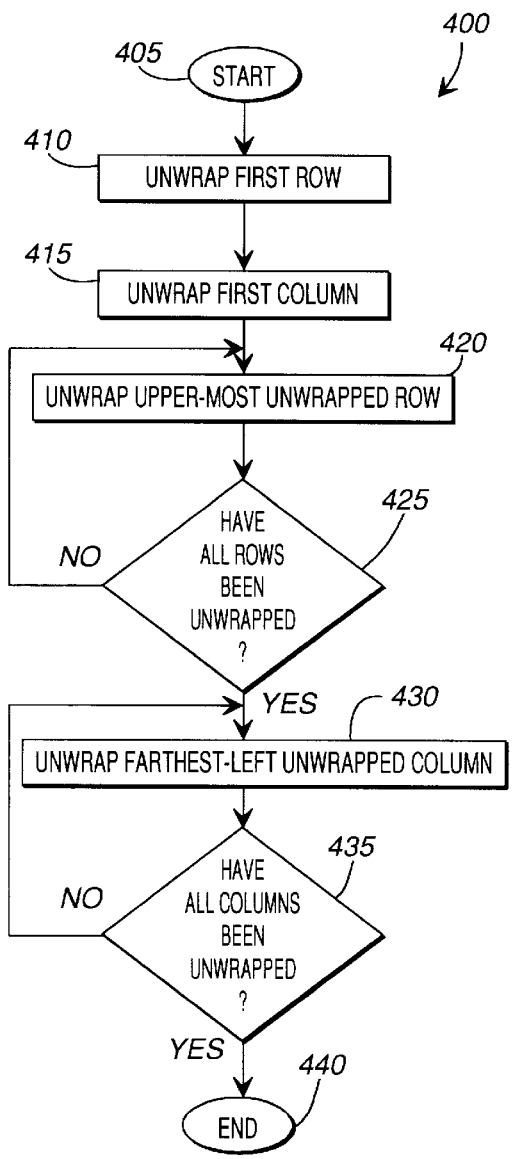
FIG. 6 is a flow diagram illustrating an exemplary method for resolving discontinuities between neighboring values in a two-dimensional array of phase values.

Turning now to FIGS. 5–6, and with occasional reference to FIG. 2, an exemplary method for resolving discontinuities between neighboring values in a two-dimensional array of phase values will be described. This method can be characterized as including two parts, the first of which is a method 300 (FIG. 5) for resolving discontinuities between neighboring values in a one-dimensional array, and the second of which is a method 400 (FIG. 6) for resolving discontinuities between neighboring values in a two-dimensional array of phase values. The "resolving of discontinuities" can be characterized as "unwrapping."

Turning now to FIG. 5, and with occasional reference to FIG. 2, the exemplary method 300 for resolving discontinuities between neighboring values in a one-dimensional array of gray-scale phase values will be described. As mentioned above, FIG. 2 illustrates a convention for defining pixel position within a two-dimensional array. Each pixel is denominated as $P_{i,j}$, where "i" is a row number and "j" is a column number. Each two-dimensional array includes "m" rows and "n" columns of pixels. The rows are numbered consecutively from top-to-bottom, starting with row zero. The columns are numbered consecutively from left-to-right, starting with column zero. Those skilled in the art will appreciate that a two-dimensional array of pixels or pixel data can be characterized as including numerous one-dimensional arrays, which may extend horizontally, vertically, or diagonally across the two dimensional array. As a convention, each pixel or pixel data in such a one-dimensional array is denominated as $P_z$, where "z" designates a position along the one-dimensional array, and the pixels or pixel data of the one-dimensional array are numbered consecutively from one end to the other end of the one-dimensional array, starting with zero.

The exemplary method 300 is applied to a one-dimensional array of a two-dimensional array of gray-scale phase values to resolve discontinuities between neighboring values in the one-dimensional array, and thereby "unwrap" the array. More specifically, the exemplary method 300 is applied to a one-dimensional array of the two-dimensional array of gray-scale phase values created at the step 235 of method 200 (FIG. 4) and denominated as Phase{7}. As will be discussed in greater detail below, the method 300 operates in conjunction with the method 400 (FIG. 6), so, for the purposes of our discussion of the method 300, it can be assumed that a one-dimensional array of a two-dimensional array of gray-scale phase values as been selected, and the method 300 is to be applied to that selected one-dimensional array.

The method 300 begins at the step 305 and proceeds to the step 310. At the step 310, it is established that the second phase value in the one-dimensional array is to be considered the current phase value, since the one-dimensional array is numbered consecutively from one end to the other end of the one-dimensional array, starting with zero. Thereafter, control is transferred from the step 310 to the step 315. At the step 315, a determination is made whether the current phase value minus the preceding and adjacent phase value is less than or equal to the integer 127. If a negative determination is made at the step 315, control is transferred to the step 320. At the step 320, the integer 256 is subtracted from the current phase value. Thereafter, control is transferred from the step 320 to the step 315. If a positive determination is made at the step 315, control is transferred to the step 325.

At the step 325, a determination is made whether the current phase value minus the preceding and adjacent phase value is greater than or equal to the negative integer 127. If a negative determination is made at the step 325, control is transferred to the step 330. At the step 330, the integer 256 is added to the current phase value. Thereafter, control is transferred from the step 330 to the step 325. If a positive determination is made at the step 325, control is transferred to the step 335.

At the step 335, a determination is made whether the current phase value is the last phase value in the one-dimensional array being subjected to the method 300. If a negative determination is made at the step 335, control is transferred to the step 340, where the phase value succeeding (i.e., following) and adjacent to the current phase value becomes the current phase value. Control is transferred from the step 340 to the step 315. If a positive determination is made at the step 335, control is transferred to the step 345, to end the method 300.

Turning now to FIG. 6, and with occasional reference to FIG. 2, the exemplary method 400 for resolving discontinuities between neighboring values in a two-dimensional array of phase values will be described. The method 400 may follow immediately after the method 200 (FIG. 4), and in accordance with the exemplary embodiment of the present invention, the method 400 is applied to the two-dimensional array of gray-scale phase values created at the step 235 (FIG. 4) and denominated as Phase{7}. The method 400 begins at the step 405, and thereafter control is transferred to the step 410.

At the step 410, the method 300 (FIG. 5) is applied to the first row of the two-dimensional array of gray-scale phase values created at the step 235 and denominated as Phase{7}, beginning at the left end of that first row. That is, the first row of the two-dimensional array of gray-scale phase values created at the step 235 and denominated as Phase{7} is unwrapped. Thereafter, control is transferred from the step 410 to the step 415. At the step 415, the method 300 is applied to the first column of the two-dimensional array of gray-scale phase values created at the step 235 and denominated as Phase{7}, beginning at the top of that first column. That is, the first column of the two-dimensional array of gray-scale phase values created at the step 235 and denominated as Phase{7} is unwrapped. Thereafter, control is transferred to the step 420.

At the step 420, the method 300 is applied to the upper-most unwrapped row of the two-dimensional array of gray-scale phase values created at the step 235 and denominated as Phase{7}, beginning proximate to the left end of that upper-most unwrapped row. Thereafter, control is transferred to the step 425 where a determination is made whether the method 300 has been applied to all of the rows of the two-dimensional array of gray-scale phase values created at the step 235 and denominated as Phase{7}.

That is, a determination is made whether all of the rows of the two-dimensional array of gray-scale phase values created at the step 235 and denominated as Phase{7} have been unwrapped. If a negative determination is made at the step 425, control is transferred back to the step 420. That is, the method 400 continues to loop through the steps 420 and 425 until all of the rows of the two-dimensional array of gray-scale phase values created at the step 235 and denominated as Phase{7} have been unwrapped. The method 400 loops through the steps 420 and 425 so that the second row of the two-dimensional array of gray-scale phase values created at the step 235 and denominated as Phase{7} is unwrapped, and thereafter the third row of the two-dimensional array of gray-scale phase values created at the step 235 and denominated as Phase{7} is unwrapped, and thereafter the fourth row of the two-dimensional array of gray-scale phase values created at the step 235 and denominated as Phase {7} is unwrapped, and so on in sequential order until all of the rows of the two-dimensional array of gray-scale phase values created at the step 235 and denominated as Phase{7} are unwrapped. Thereafter, a positive determination is made at the step 425 and control is transferred to the step 430.

At the step 430, the method 300 is applied to the left-most unwrapped column of the two-dimensional array of gray-scale phase values created at the step 235 and denominated as Phase{7}, beginning proximate to the top end of that left-most unwrapped column. Thereafter, control is transferred to the step 435 where a determination is made whether the method 300 has been applied to all of the columns of the two-dimensional array of gray-scale phase values created at the step 235 and denominated as Phase{7}. That is, a determination is made whether all of the columns of the two-dimensional array of gray-scale phase values created at the step 235 and denominated as Phase{7} have been unwrapped. If a negative determination is made at the step 435, control is transferred back to the step 430. The method 400 continues to loop through the steps 430 and 435 until all of the columns of the two-dimensional array of gray-scale phase values created at the step 235 and denominated as Phase{7} have been unwrapped. The method 400 loops through the steps 430 and 435 so that the second column of the two-dimensional array of gray-scale phase values created at the step 235 and denominated as Phase{7} is unwrapped, and thereafter the third column of the two-dimensional array of gray-scale phase values created at the step 235 and denominated as Phase{7} is unwrapped, and thereafter the fourth column of the two-dimensional array of gray-scale phase values created at the step 235 and denominated as Phase{7} is unwrapped, and so on in sequential order until all of the columns of the two-dimensional array of gray-scale phase values created at the step 235 and denominated as Phase{7} are unwrapped. Thereafter, a positive determination is made at the step 435 and control is transferred to the step 440 to end the method 400.

Exemplary Method for Calculating Displacements

The method 400 can be described as converting the two-dimensional array of wrapped gray-scale phase values denominated as Phase{7} into a two-dimensional array of unwrapped gray-scale phase values denominated as Phase{8}. A two-dimensional array of displacement values can be calculated from the two-dimensional array of unwrapped gray-scale phase values denominated as Phase{8} by using the following Displacement equation:

$$\text{Displacement}_{i,j} = \text{Phase}\{8\}_{i,j}((\text{Grating Pitch})/(256/(\tan(\text{angle A}) + \tan(\text{angle B}))))$$

In accordance with the exemplary embodiment of the present invention, the angle "A" of incidence of the light emitted from the light source 32 upon the grating 28 and the object 22 being examined is approximately 45°, and the angle "B" of incidence from which the detector 36 views the grating and the object is equal to approximately 0°. Further, the grating pitch is 100 lines per inch. Those skilled in the art will appreciate that the surface flatness of the object 22 can be quantified by calculating various values from the two-dimensional array of displacement values. For example, bow and twist can be calculated, two-dimensional "cross-sections" of the surface of the object can be plotted, three-dimensional views of the surface of the object can be plotted, and the like. Those skilled in the art will also appreciate that such quantifying information, as well as the information generated at the various stages of the methods 100-400 (FIGS. 3-6) can be viewed on the monitor 52 (FIG. 1) connected to the computer 50 (FIG. 1).

In accordance with the exemplary embodiment of the present invention, the above-mentioned methods may be repeated for each object 22 (FIG. 1) of a sequence of objects introduced to the system 20 (FIG. 1). Such sequential introduction and removal of objects 22 from the system 20 may be facilitated by a conveyorized system combined with the system 20.

Exemplary Components of the Present Invention

Referring to FIG. 1, the grating 28 may be an optical grating of the Ronchi type (parallel opaque and transparent stripes on a transparent substrate, typically with a periodicity of 50–1000 lines per inch). More specifically, in accordance with the exemplary embodiment of the present invention, the grating 28 is a Ronchi-type grating with a chromium oxide pattern of 100 lines per inch. The grating 28 may be in the shape of a fourteen inch by fourteen inch square and may be made of Tempax or Pyrex glass. Such a grating 28 can be obtained from Max Levy Autograph, of Philadelphia, Pa.

The light source 32 provides collimated white light, and but for the grating 28, the light source would provide light over the entire upper surface of the object 22. More specifically, the light source 32 can be a Model 765A Moiré Projector, which is available from Newport Corp., of Irvine, Calif.

The detector 36 is a video camera with associated lens which, but for the grating 28, could capture an image of the entire upper surface of the object 22. More specifically, the detector 36 may be a monochrome RS-170 video camera such as the Model TM-7CN Camera available from Pulnix, of Sunnyvale, Calif.

The electromechanical assembly 26 is a mechanical system for varying the distance between the object 22 and the grating 28, and such a system may contain one or more linear translation stages, motor, motor drive circuits, and electronic control circuitry. More specifically, the electromechanical assembly 26 combines linear stages (Model ATS03005), brushless servo motors (Model BM75E), motor drive amplifiers (Model BA10-160), and a controller (Model U500), all of which are available from Aerotech, of Pittsburgh, Pa.

The computer 50 may be any type of computing device containing a microprocessor, data storage medium, and interface for operating in accordance with the present invention. More specifically, the computer 50 may be a desktop computer that includes a PENTIUM 133 MHz processor and runs the WINDOWS 95 brand operating system. The computer 50 preferably contains separate plug-in computer cards for a video frame-grabber and the actuator controller 46. A frame-grabber is an electronic device which converts the video signal produced by the detector 36 to a set of digital information readable by the computer 50. The frame-grabber may also have capabilities for storing and preprocessing the information before it is transferred to the computer 50. An acceptable frame-grabber is the Model OC-TCXO-TCD20 frame-grabber, which is available from Coreco, of St. Laurent, Quebec, Canada.

The enclosure 24 is a light-tight sheet metal housing which provides support for the light source 32 and the detector 36. The overall size of the enclosure 24 is approximately 3 feet high by 4 feet wide by 18 inches deep. There may be a front panel door through which an object 22 is introduced to, or removed from, the platform 44 of the electromechanical assembly 26.

Exemplary Alternative Embodiments

In accordance with alternative embodiments of the present invention, three or more than four out of phase shadow moiré fringe pattern images are obtained and used to calculate phase values, and the above-mentioned methods and equations are modified accordingly to compensate for the different number of images.

In accordance with alternative embodiments of the present invention, the system 20 may incorporate a heating assembly for causing an object 22 within the system 20 to be exposed to a controlled temperature range. More specifically, the object 22, grating 28, the platform 44 and upper portions of the support arms 42a and 42b are enclosed within an insulated chamber containing equipment for temperature measurement and control, such as an oven. In accordance with these alternative embodiments, the above-mentioned methods are repeated for an object 22 while the object is at different temperatures. This provides an indication of the manner m which temperature affects the surface flatness of the object 22.

The heating assembly of the alternative embodiments may include a temperature control chamber in the form of an insulated oven capable of heating an object 22 to a temperature of 250° C. The internal dimensions of the chamber may be approximately 10 inches wide by 10 inches deep by 5 inches high. Heat is supplied by an infrared radiant heater bank. A suitable heater is designated as Model Raymax 1626, which is available from Watlow, of St. Louis, Mo. The oven contains a door through which the object 22 is loaded and unloaded. The temperature control system of the heating assembly may include a temperature controller (such as a data acquisition board Model AT-MIO-16XE which is available from National Instruments, of Austin, Tex.), one or more thermocouples (such as K-Type thermocouples available from Omega Engineering, of Stamford, Conn.) and signal conditioning modules (such as Model 5B47 modules which are available from National Instruments), and a voltage control for supplying AC power to the unit heater (such as a Model DB1C-3024-COSO controller available from Watlow).

The invention may conveniently be implemented in one or more program modules that are based upon the above disclosure and accompanying drawings, and those program modules may be stored on computer readable medium, such as magnetic or optical disks, or the like. No particular programming language has been described for carrying out the various procedures described above because it is considered that the operations, the steps, and procedures described above and illustrated in the accompanying drawings are sufficiently disclosed to permit one of ordinary skill in the art to practice the present invention. Moreover, there are many computers and operating systems which may be used in practicing the present invention and therefore no detailed computer program module could be provided which would be applicable to all of these many different systems. Each user of a particular computer will be aware of the language and tools which are most useful for that user's needs and purposes.

The present invention has been described in relation to particular embodiments which are intended in all respects to be illustrative rather than restrictive. Alternative embodiments will become apparent to those skilled in the art to which the present invention pertains without departing from its scope. Accordingly, the scope of the present invention is defined by the appended claims rather than the foregoing description.

What is claimed is:

1. A method for quantifying the flatness of a surface, comprising the steps of:

creating a first shadow moiré fringe pattern that is indicative of the flatness of the surface;

capturing a first digitized image that includes at least the first shadow moiré fringe pattern;

creating a second shadow moiré fringe pattern that is indicative of the flatness of the surface, comprising introducing a phase shift between the first and second shadow moiré fringe patterns;

capturing a second digitized image that includes at least the second shadow moiré fringe pattern;

creating a third shadow moiré fringe pattern that is indicative of the flatness of the surface, comprising introducing a phase shift between the first, second, and third shadow moiré fringe patterns;

capturing a third digitized image that includes at least the third shadow moiré fringe pattern;

calculating a two-dimensional array of phase values from at least the first, second and third digitized images;

eliminating at least some of the discontinuities between adjacent phase values in the two-dimensional array, comprising:

searching for discontinuities between adjacent phase values in a plurality of one-dimensional arrays of the two-dimensional array, wherein for each of the one-dimensional arrays the searching progresses along the length of the one-dimensional array and comprises searching for discontinuities of a predetermined value between adjacent phase values in the one-dimensional array, and adjusting a phase value in response to determining that a discontinuity of the predetermined value exists between the phase value and an adjacent phase value in the same one-dimensional array, wherein the plurality of one-dimensional arrays comprises a row of the two-dimensional array and a column of the two-dimensional array; and calculating displacements from at least some of the phase values, after the eliminating step.

2. The method of claim 1, wherein:
the row is a first row and the column is a first column; and
the plurality of one-dimensional arrays further comprises a second row of the two-dimensional array and a second column of the two-dimensional array.

3. The method of claim 1, wherein the row is a first row that is at an edge of the two-dimensional array and the column is a first column that is at an edge of the two-dimensional array.

4. The method of claim 3, wherein the searching and any adjusting are carried out for the first row and are thereafter for the second row.

5. The method of claim 3, wherein the searching carried out for the first row and the first column originate proximate to the same corner of the two-dimensional array.

6. The method of claim 1, wherein:
the row is a first row and the column is a first column, and
the plurality of one-dimensional arrays further comprises a plurality of rows, wherein the searching carried out for each of the plurality of rows originates proximate to the first column.

7. The method of claim 6, wherein the plurality of one-dimensional arrays further comprises a plurality of columns, wherein the searching carried out for each of the plurality of columns originates proximate to the first row.

8. A method for quantifying the flatness of a surface using at least a first digitized image of a first shadow moiré fringe pattern that is indicative of the flatness of the surface, a second digitized image that includes at least a second shadow moiré fringe pattern that is indicative of the flatness of the surface, and a third digitized image that includes at least a third shadow moiré fringe pattern that is indicative of the flatness of the surface, wherein a phase shift has been introduced between each of the first, second, and third fringe patterns, comprising:

calculating a first two-dimensional array of phase values from at least the first, second and third digitized images;

calculating a plurality of two-dimensional arrays of image values from the first two-dimensional array of phase values;

applying a filter to at least one of the two-dimensional arrays of image values to create a two-dimensional array of filtered image values; and calculating a second two-dimensional array of phase values from at least the two-dimensional array of filtered image values.

9. The method of claim 8, further comprising the steps of eliminating at least some of the discontinuities between adjacent phase values in the second two-dimensional array of phase values, comprising:

searching for discontinuities between adjacent phase values in a plurality of one-dimensional arrays of the second two-dimensional array of phase values, wherein for each of the one-dimensional arrays the searching progresses along the length of the one-dimensional array and comprises searching for discontinuities of a predetermined value between adjacent phase values in the one-dimensional array, and adjusting a phase value in response to determining that a discontinuity of the predetermined value exists between the phase value and an adjacent phase value in the same one-dimensional array; and calculating displacements from at least some of the phase values, after the eliminating step.

10. The method of claim 9, wherein the applying step comprises calculating an average of a plurality of image values of the at least one of the two-dimensional arrays of image values.

11. The method of claim 10, wherein the average is a weighted average.

12. The method of claim 9, wherein the applying step comprises replacing a first image value of the at least one of the two-dimensional arrays of image values with an average of at least a plurality of image values that are proximate to the first image data value.

13. The method of claim 12, wherein the average is a weighted average.

14. The method of claim 12, wherein the applying step comprises replacing the first image data value with a weighted average of at least a first plurality of image values, the first plurality comprising a second plurality of image values that are proximate to and at least partially bound the first image data value and a third plurality of image values that at least partially bound the second plurality of image values, wherein the second plurality of image values are weighted more heavily than the third plurality of image values in the weighted average.

15. A method for quantifying the flatness of a surface, comprising the steps of:

creating a first shadow moiré fringe pattern that is indicative of the flatness of the surface;

capturing a first digitized image that includes at least the first shadow moiré fringe pattern;

creating a second shadow moiré fringe pattern that is indicative of the flatness of the surface, comprising introducing a phase shift between the first and second shadow moiré fringe patterns;

capturing a second digitized image that includes at least the second shadow moiré fringe pattern;

creating a third shadow moiré fringe pattern that is indicative of the flatness of the surface, comprising introducing a phase shift between the first, second, and third shadow moiré fringe patterns;

capturing a third digitized image that includes at least the third shadow moiré fringe pattern;

creating a fourth shadow moiré fringe pattern that is indicative of the flatness of the surface, comprising introducing a phase shift between the first, second, third and fourth shadow moiré fringe patterns;

capturing a fourth digitized image that includes at least the fourth shadow moiré fringe pattern;

calculating a two-dimensional array of phase values from at least the first, second, third and fourth digitized images, wherein the phase values are equal to arctan $((I_2-I_4)/(I_1-I_3))$, wherein "$I_1$" is the light intensity of a pixel in the first shadow moiré fringe pattern, "$I_2$" is the light intensity of the pixel in the second shadow moiré fringe pattern, "$I_3$" is the light intensity of the pixel in the third shadow moiré fringe pattern, and "$I_4$" is the light intensity of the pixel in the fourth shadow moiré fringe pattern.

16. The method of claim 15, wherein:
the light intensity "$I_1$" of the pixel in the first shadow moiré fringe pattern is approximated by $I_0+A\cos\phi$;
the light intensity "$I_2$" of the pixel in the second shadow moiré fringe pattern is approximated by $I_0+A\cos[\phi+(\pi/2)]$;

the light intensity "$I_3$" of the pixel in the third shadow moiré fringe pattern is approximated by $I_0+A\cos[\emptyset+\pi]$; and the light intensity "$I_4$" of the pixel in the fourth shadow moiré fringe pattern is approximated by $A\cos[\emptyset+(3\pi)/2)]$.

17. A system for quantifying the flatness of a surface, comprising means for:

creating a first shadow moiré fringe pattern that is indicative of the flatness of the surface;

capturing a first digitized image that includes at least the first shadow moiré fringe pattern;

creating a second shadow moiré fringe pattern that is indicative of the flatness of the surface, comprising introducing a phase shift between the first and second shadow moiré fringe patterns;

capturing a second digitized image that includes at least the second shadow moiré fringe pattern;

creating a third shadow moiré fringe pattern that is indicative of the flatness of the surface, comprising introducing a phase shift between the first, second, and third shadow moiré fringe patterns;

capturing a third digitized image that includes at least the third shadow moiré fringe pattern;

calculating a two-dimensional array of phase values from at least the first, second and third digitized images;

eliminating at least some of the discontinuities between adjacent phase values in the two-dimensional array, comprising:

searching for discontinuities between adjacent phase values in a plurality of one-dimensional arrays of the two-dimensional array, wherein for each of the one-dimensional arrays the searching progresses along the length of the one-dimensional array and comprises searching for discontinuities of a predetermined value between adjacent phase values in the one-dimensional array, and adjusting a phase value in response to determining that a discontinuity of the predetermined value exists between the phase value and an adjacent phase value in the same one-dimensional array, wherein the plurality of one-dimensional arrays comprises a row of the two-dimensional array and a column of the two-dimensional array; and calculating displacements from at least some of the phase values.

18. A system for quantifying the flatness of a surface, comprising means for:

introducing a phase shift between and digitizing at least a first shadow moiré fringe pattern that is indicative of the flatness of the surface, a second digitized image that includes at least a second shadow moiré fringe pattern that is indicative of the flatness of the surface, and a third digitized image that includes at least a third shadow moiré fringe pattern that is indicative of the flatness of the surface;

calculating a first two-dimensional array of phase values from at least the first, second and third digitized images;

calculating a plurality of two-dimensional arrays of image values from the first two-dimensional array of phase values;

applying a filter to at least one of the two-dimensional arrays of image values to create a two-dimensional array of filtered image values; and calculating a second two-dimensional array of phase values from at least the two-dimensional array of filtered image values.

* * * * *